(12) United States Patent
Tran et al.

(10) Patent No.: US 6,473,337 B1
(45) Date of Patent: Oct. 29, 2002

(54) MEMORY DEVICE HAVING MEMORY CELLS WITH MAGNETIC TUNNEL JUNCTION AND TUNNEL JUNCTION IN SERIES

(75) Inventors: Lung T. Tran, Saratoga, CA (US); Manish Sharma, Sunnyvale, CA (US); Thomas C. Anthony, Sunnyvale, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/983,404

(22) Filed: Oct. 24, 2001

(51) Int. Cl.$^7$ ................................. G11C 11/15
(52) U.S. Cl. .................... 365/173; 365/158; 365/171
(58) Field of Search ................. 365/158, 171, 365/173, 232, 65, 66

(56) References Cited

U.S. PATENT DOCUMENTS

| | | | |
|---|---|---|---|
| 5,701,222 A | * 12/1997 | Gill et al. ............ | 360/314 |
| 5,991,193 A | * 11/1999 | Gallagher et al. ...... | 365/171 |
| 6,104,632 A | * 8/2000 | Nishimura ............. | 365/158 |
| 6,269,018 B1 | * 7/2001 | Monsma et al. ........ | 365/145 |
| 6,331,944 B1 | * 12/2001 | Monsma et al. ........ | 365/158 |

* cited by examiner

*Primary Examiner*—David Nelms
*Assistant Examiner*—Gene N. Auduong

(57) ABSTRACT

A memory device includes dual tunnel junction memory cells having a magnetic tunnel junction in series with a tunnel junction. The magnetic tunnel junction can be changed from a first resistance state to a second resistance state during a write operation. The magnetic tunnel junction can have a differing resistance-voltage characteristic than the tunnel junction, and the differing resistance-voltage characteristics allow the magnetic tunnel junction to be blown without blowing the tunnel junction during a write operation. The change in resistance state of the magnetic tunnel junction changes the resistance of the selected memory cell, which is detectable during a read operation.

11 Claims, 8 Drawing Sheets

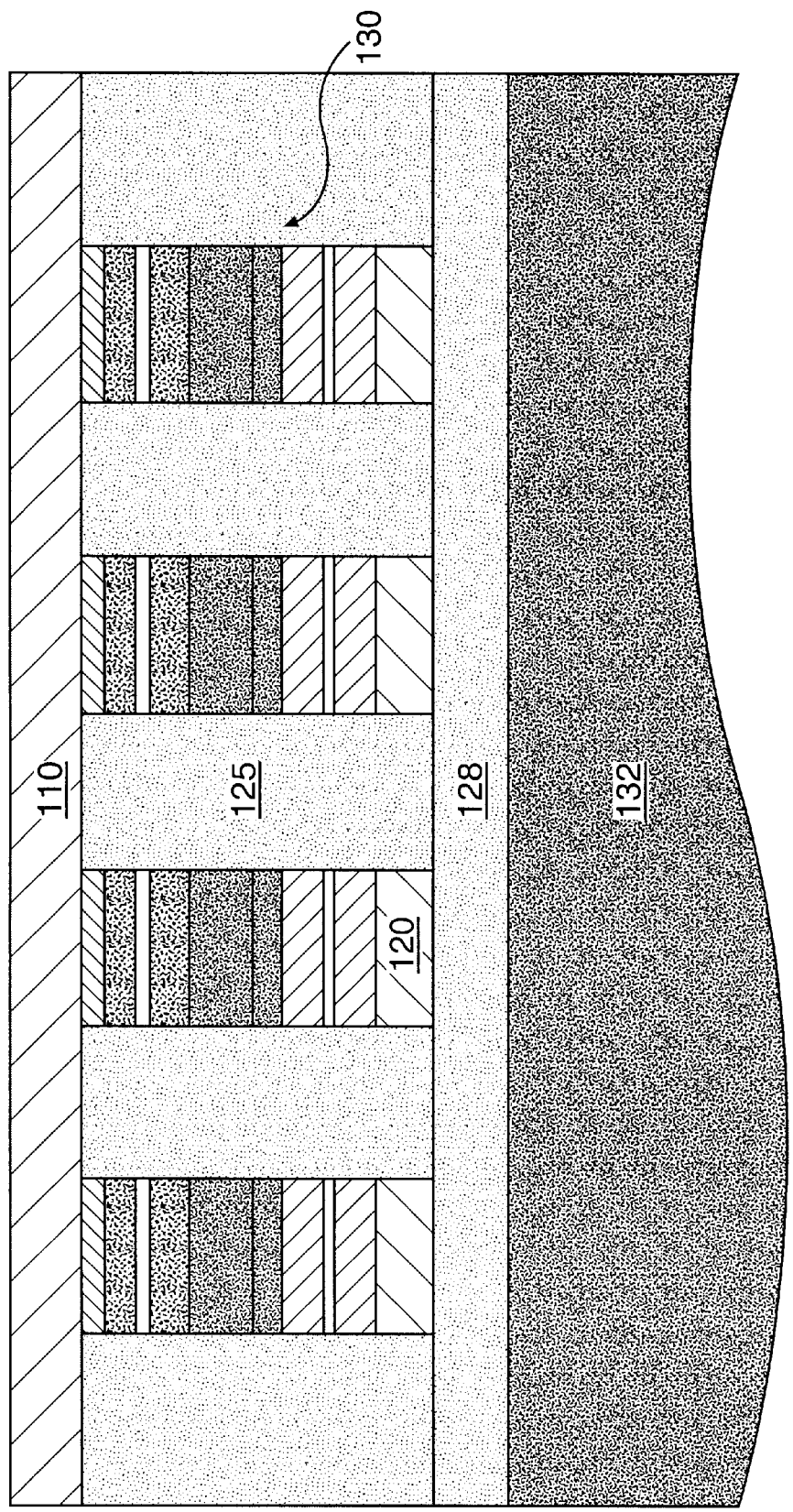

MEMORY DEVICE HAVING MEMORY CELLS WITH MAGNETIC TUNNEL JUNCTION AND TUNNEL JUNCTION IN SERIES

RELATED APPLICATION

The following application of the common assignee may contain some common disclosure and may relate to the invention:

U.S. patent application Ser. No. 09/951,378, entitled "MEMORY DEVICE HAVING DUAL TUNNEL JUNCTION MEMORY CELLS".

TECHNICAL FIELD

The technical field is memory devices for storing data. More particularly, the technical field is memory devices having memory cells with tunnel junctions in series.

BACKGROUND

Memory devices are utilized in consumer electronic products to store data such as instructions utilized by the products. Nonvolatile memory devices are desirable because they do not require power to retain data. Therefore, data stored in nonvolatile memory devices is preserved when a power supply is exhausted or disconnected from the memory device. Consumers also prefer products of small volume and low cost, and the requirements of non-volatility, high density, and low cost are primary driving factors in the design of memory devices. Low power consumption is also desirable because smaller power sources can be used, reducing the size of consumer electronic products.

Nonvolatile memory devices typically have one time programmable (OTP) or re-programmable memory cells. A re-programmable memory cell can be switched among binary states. An OTP memory cell's state is permanent once the cell is programmed. OTP memory devices can generally be classified as one of fuse, anti-fuse, charge storage, or mask read only memory (mask ROM).

A fuse memory cell is programmed by applying a voltage across the cell so that the cell is "blown" during programming. The binary state of fuse memory cells can be detected as the resistance of the cell measured during a read process. Conventional fuse memory devices have a low array density because the contact regions required for each fuse element occupy a large area of the substrate. Conventional fuse memory cells also often include an isolation element such as a diode or transistor, which further increases cell size. Isolation diodes and transistors have limited current capability, and may be damaged by the write currents required to program the fuse memory cells. In addition, the isolation diodes and transistors are typically active silicon-based elements, which are most readily formed on a silicon crystal substrate. Isolation elements of this type may preclude stacking of multiple layers of fuse OTP arrays, decreasing possible device capacity. Silicon-based isolation elements such as micro-crystalline and amorphous diodes and transistors may enable stacking, but increase complexity and cost of fabrication.

Conventional anti-fuse memory cells typically include a metal-dielectric-metal stack. Conventional anti-fuse memory cells are programmed by applying a write potential across the cells. The write potential triggers the anti-fuse and reduces the resistance of a programmed memory cell. Conventional anti-fuse memory cells suffer many of the same disadvantages as fuse/transistor cells. For example, conventional anti-fuse memory cells may require silicon-based isolation elements, which decrease array density.

A common conventional charge storage memory is EPROM. EPROM memory utilizes Fowler-Nordheim tunneling to transfer charge from a substrate to a floating gate in the memory cell. EPROM memories require a large write voltage, and the write speed in EPROM devices is limited by tunneling current density.

Mask ROM memories are programmed at the time of fabrication, rather than at the user level ("field programming"). Therefore, each batch of mask ROM devices is application-specific. As in most manufacturing processes, cost savings are realized with increased volume. Therefore, in order for mask ROM production to be cost-effective, there must be a large demand for a particular application-specific memory. The requirement for large-scale processing renders mask ROM too costly for many applications.

A need therefore exists for a low-cost memory device having memory cells capable of high density arrangement. A need also exists for a memory device that does not require excessive processing power.

SUMMARY

According to a first aspect, a memory device includes dual tunnel junction memory cells having a magnetic tunnel junction in series with a tunnel junction. The magnetic tunnel junction can be changed from a first resistance state to a second resistance state during a write operation. The magnetic tunnel junction has a differing resistance-voltage characteristic than the tunnel junction, and the differing resistance-voltage characteristics allow the magnetic tunnel junction to be blown without blowing the tunnel junction during a write operation. The magnetic tunnel junction can function as an anti-fuse so that blowing the magnetic tunnel junction creates a short across the magnetic tunnel junction. The resulting change in resistance of the memory cell is detectable during a read operation.

According to the first aspect, the tunnel junction can provide an isolation function for the programmed memory cell when the magnetic tunnel junction is blown. Therefore, silicon-based isolation diodes and/or transistors are not required to isolate the memory cells in the memory device. The memory device can therefore include stacked layers of memory elements, increasing device capacity.

Also according to the first aspect, the memory cells are smaller than conventional memory cells having diode/transistor isolation elements. This aspect increases array density. The absence of diode/transistor isolation elements also simplifies the manufacture of the memory device.

According to a second aspect, a selected memory cell can be programmed by applying a write current or a write voltage to the memory cell. The resistance of the magnetic tunnel junction decreases more gradually than the tunnel junction when the write current or write voltage is applied.

According to the second aspect, a higher voltage is developed across the magnetic tunnel junction because of a higher resistance of the magnetic tunnel junction. As the resistance of the tunnel junction decreases more rapidly than the resistance of the magnetic tunnel junction, a greater portion of the voltage developed across the memory cell is across the magnetic tunnel junction. The write voltage or current can accordingly be selected so that the relatively high voltage across the magnetic tunnel junction exceeds a breakdown voltage of the magnetic tunnel junction, while the relatively low voltage developed across the tunnel junction does not exceed a breakdown voltage of the tunnel junction.

According to a third aspect, the breakdown voltages and resistance-voltage characteristics of the tunnel junction and the magnetic tunnel junction can be determined according to the materials used to form the magnetic tunnel junction and the tunnel junction.

According to the third aspect, manufacture of the memory cells is simplified because of the relative ease involved in varying the particular materials used to form the tunnel junctions.

According to a fourth aspect, the memory cells can be made using conventional processes, such as deposition and sputtering processes.

According to the fourth aspect, the memory device can be manufactured at relatively low cost.

Other aspects and advantages will become apparent from the following detailed description, taken in conjunction with the accompanying drawings.

DESCRIPTION OF THE DRAWINGS

The detailed description will refer to the following drawings, in which like numerals refer to like elements, and in which:

FIG. 3A is a sectional view of a portion of the memory array illustrated in FIG. 1;

DETAILED DESCRIPTION

A memory device having dual tunnel junction memory cells will be discussed by way of preferred embodiments and by way of the drawings.

Figure 1:
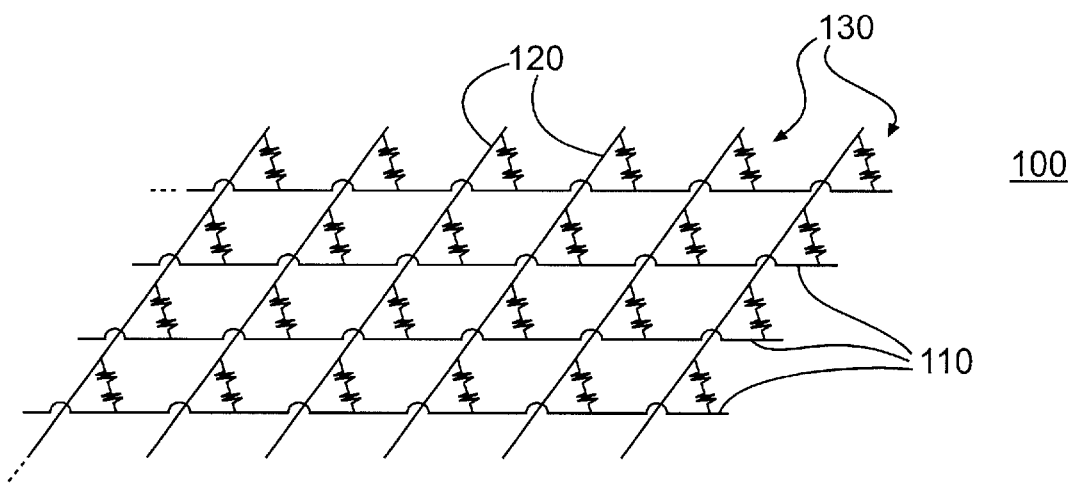
FIG. 1 is a schematic perspective view of a memory array having dual tunnel junction memory cells.

FIG. 1 is a schematic perspective view of a memory array 100 having dual tunnel junction memory cells 130. In the memory array 100, word lines 110 extend in horizontal rows, and bit lines 120 extend in vertical columns. The word lines 110 cross the bit lines 120 at memory cells 130. Each memory cell 130 can store a binary state of either "1" or "0." In FIG. 1, the dual tunnel junction memory cells 130 are illustrated symbolically as two resistive elements. Each resistive element corresponds to a tunnel junction in a memory cell 130.

Figure 2:
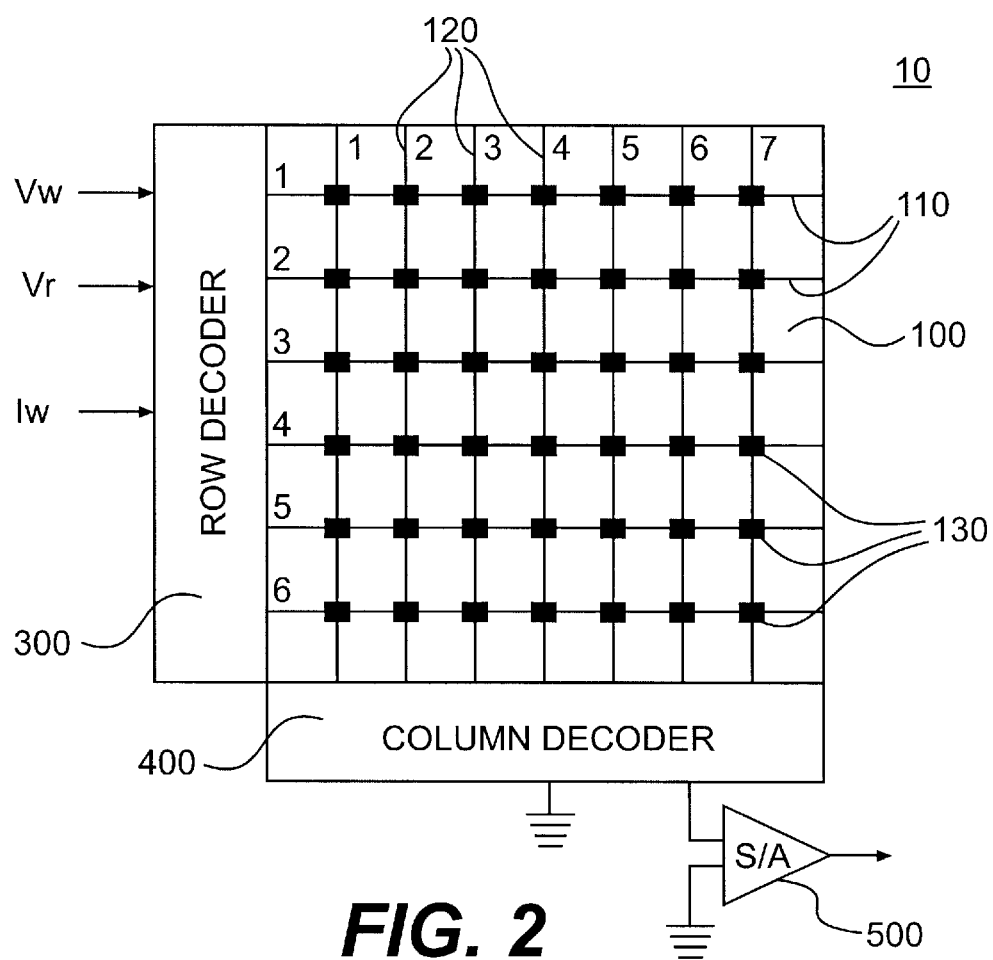
FIG. 2 is a schematic view of a memory device including a memory array as illustrated in FIG. 1, and associated read/write circuitry.

FIG. 2 is a schematic view of a memory device 10 including the memory array 100 illustrated in FIG. 1, and associated read/write circuitry. The memory device 10 comprises the memory array 100, a row decoder 300 coupled to rows 1–6 of the memory array 100, a column decoder 400 coupled to columns 1–7 of the memory array 100, and a sense amplifier 500 for detecting a binary state of the memory cells 130 during read processes. In FIG. 2, six rows of word lines 110 and seven columns of bit lines 120, intersecting at forty-two memory cells 130, are shown for the purposes of illustration. In practice, arrays of 1024×1024 memory cells and larger, for example, may be used.

The row decoder 300 includes a plurality of switches for selectively applying a programming, or write voltage Vw, or a write current Iw to rows containing a selected memory cell 130 during write processes, or for applying a read potential Vr during read processes. Similarly, the column decoder 400 can include a plurality of switches for coupling selected columns containing selected memory cells 130 to ground during write processes, or for coupling selected columns to the sense amplifier 500 during read processes.

In order to program, or "write to" a selected memory cell 130, the row decoder 300 closes a switch between the write voltage Vw or the write current Iw and the row line 110 in the selected column, and the column decoder 400 closes a switch between ground and the bit line 120 in the selected column. The choice between the write voltage Vw and the write current Iw may depend, for example, on the type of dual tunnel junction memory cells 130 included in the memory array 100, or a desired mode of operation for the memory device 10.

According to an embodiment, the two tunnel junctions in a memory cell 130 have differing resistance-voltage characteristics. The differing resistance-voltage characteristics are selected so that the write voltage Vw or the write current Iw applied to the selected memory cell 130 is sufficient to break down, or "blow" a first, magnetic tunnel junction of the selected memory cell 130, thereby changing the resistance of the selected memory cell 130. The write voltage Vw and the write current Iw are insufficient to blow a second, tunnel junction of the memory cell 130.

The differing resistance-voltage characteristics may be realized from the materials used to form the magnetic tunnel junction and the tunnel junction. Specifically, Applicants have observed that tunnel junctions including magnetic layers, or "electrodes," generally decrease in resistance more gradually under an applied voltage than tunnel junctions having non-magnetic electrodes. Therefore, when a write voltage Vw or a write current Iw is applied to a selected memory cell, a magnetic tunnel junction's resistance decreases more gradually than a tunnel junction's resistance. In selected embodiments, the resistance of the magnetic tunnel junction can be greater than the resistance of the tunnel junction, by, for example, an order of magnitude or more. The resulting higher voltage drop across the magnetic tunnel junction can be selected to exceed a breakdown voltage of the magnetic tunnel junction, so that the magnetic tunnel junction blows while the tunnel junction is not blown.

The tunnel junction in the programmed memory cell 130 can substantially retain its pre-write resistance, and can serve as an isolation element for the programmed memory cell 130. The magnetic tunnel junction can be at a short state after application of the write voltage Vw or write current Iw. The change in resistance of the selected memory cell 130 caused by shorting the magnetic tunnel junction can be detected during a read operation. Embodiments of memory cells and write processes are discussed in detail below.

Figure 3B:
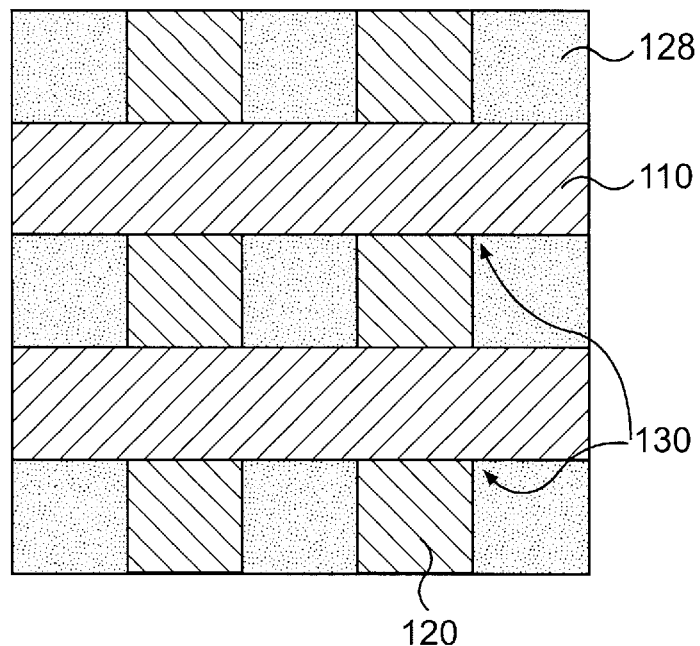
FIG. 3B is a top plan view of the portion of the memory array illustrated in FIG. 3A.
Figure 3C:
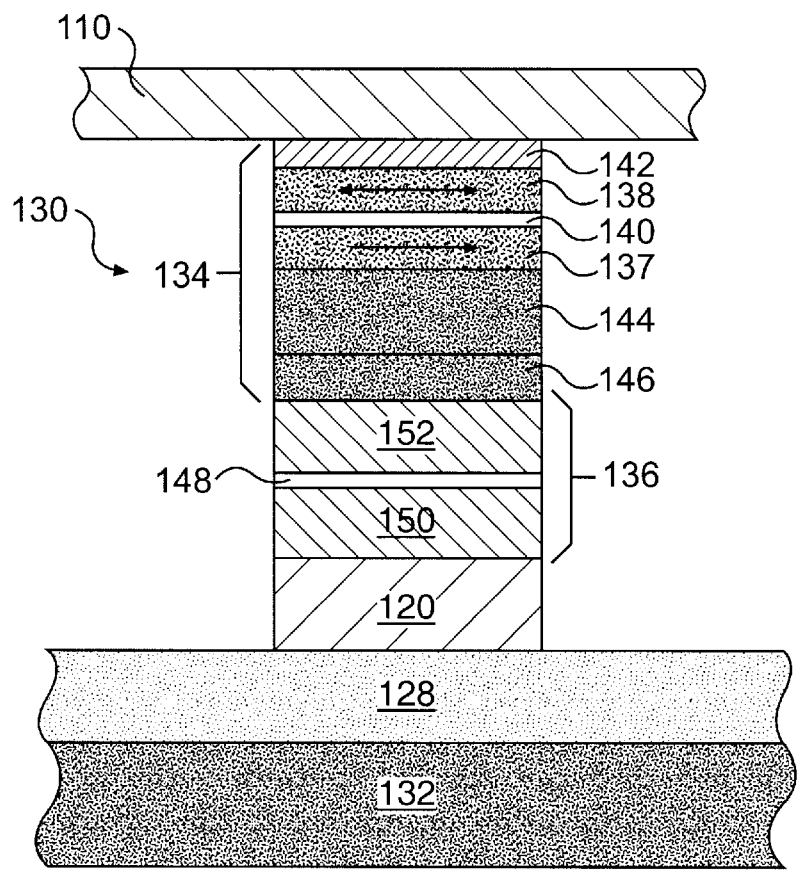
FIG. 3C is a sectional view of an embodiment of a memory cell as illustrated in FIG. 3A.

FIG. 3A is a sectional view illustrating a portion of the memory array 100 illustrated in FIG. 1, including an embodiment of the memory cells 130. FIG. 3B is a top plan view of a portion of the memory array 100. FIG. 3C is a cross sectional view of a single memory cell 130 as illustrated in FIG. 3A.

Referring to FIGS. 3A and 3B, the illustrated portion of the memory array 100 comprises a plurality of memory cells 130 located at cross points of word lines 110 and bit lines 120. The word lines 110 and the bit lines 120 can be made from conductive materials such as, for example, Al, Au, Ag, Cu, alloys thereof, and other conductors. The word lines 110 and the bit lines 120 can be formed by known processes such as, for example, sputtering and etching processes.

The bit lines 120 are disposed over an insulator layer 128 which is disposed over a substrate 132 of the memory array 100. The insulator layer 128 can be, for example $SiO_X$, $SiN_X$, $SiO_XN_Y$, $AlO_X$, $TaO_X$, $TiO_X$, $AlN_X$, and other non-conductive materials. The insulator layer 128 can be formed by, for example, a known deposition process, such as, for example, chemical vapor deposition (CVD). The substrate 132 can be, for example, a semiconductor substrate. The substrate 132 may contain electronic circuitry, and the insulator layer 128 provides isolation between the circuitry and the memory cells 130. Alternatively, the bit lines 120 can be disposed directly over the substrate 132.

An insulator 125 may be disposed over the insulator layer 128 and between the memory cells 130. The insulator 125 is not shown in FIG. 3B for the purposes of illustration. The insulator 125 can be, for example, $SiO_X$, $SiN_X$, $SiO_XN_Y$, $AlO_X$, $TaO_X$, $TiO_X$, $AlN_X$, and other non-conductive materials. The insulator 125 can be formed by, for example, deposition processes.

Referring to FIG. 3C, the memory cell 130 comprises a magnetic tunnel junction 134 and a tunnel junction 136 in series with the magnetic tunnel junction 134. A magnetic tunnel junction can be defined generally as having an insulator sandwiched between magnetic layers. The magnetic layers can be referred to as "electrodes," or "terminals" of the magnetic tunnel junction, and may be ferromagnetic. A tunnel junction can be defined generally as having an insulator sandwiched between conductive layers. The conductive layers can be referred to as electrodes or terminals of the tunnel junction. An alternative form of tunnel junction having one magnetic layer electrode is also discussed in this specification.

The magnetic tunnel junction 134 illustrated in FIG. 3C can be, for example, a tunneling magneto-resistance (TMR) tunnel junction, a spin dependent tunnel (SDT) junction, or another type of magnetic tunnel junction. In the illustrated embodiment, the magnetic tunnel junction is a TMR tunnel junction having ferromagnetic layers. The magnetic tunnel junction 134 includes a first ferromagnetic layer 137 and a second ferromagnetic layer 138. The first and second ferromagnetic layers 137, 138 are separated by an insulator 140. The second ferromagnetic layer 138 can be electrically coupled to the word line 110 by a conductive electrode 142. Alternatively, the electrode 142 can be omitted, and the second ferromagnetic layer 138 can be directly coupled to the word line 110. The magnetic tunnel junction 134 can also include an anti-ferromagnetic layer 144, and a seed layer 146 disposed over the tunnel junction 136.

The first ferromagnetic layer 137 can have a fixed orientation of magnetization, as shown by the arrow, and the second ferromagnetic layer 138 can have an orientation of magnetization that can be aligned in parallel with, or anti-parallel to, the magnetization of the first ferromagnetic layer 137. The magnetic orientations shown in FIG. 3C are not, however, required for operation of the memory cell 130.

The tunnel junction 136 is in series with the magnetic tunnel junction 134, forming the dual tunnel junction memory cell 130. The tunnel junction 136 comprises an insulator 148, a first conductor 150 coupling the insulator 148 to the bit line 120, and a second conductor 152 between the insulator 148 and the magnetic tunnel junction 134. Alternatively, the first conductor 150 can be omitted, and the insulator 148 can be directly coupled to the conductive bit line 120. The first and second conductors 150, 152 can be nonmagnetic conductors.

The magnetic tunnel junction 134 has a differing resistance-voltage characteristic than the tunnel junction 136. Magnetic tunnel junctions generally decrease in resistance more gradually under an applied voltage than tunnel junctions. Therefore, when a write voltage Vw or a write current Iw is applied to a selected memory cell 130, the magnetic tunnel junction 134 resistance will decrease more gradually than the resistance of the tunnel junction 136. Exemplary resistance values for the magnetic tunnel junction 134 and the tunnel junction 136 are illustrated in FIG. 4.

Figure 4:
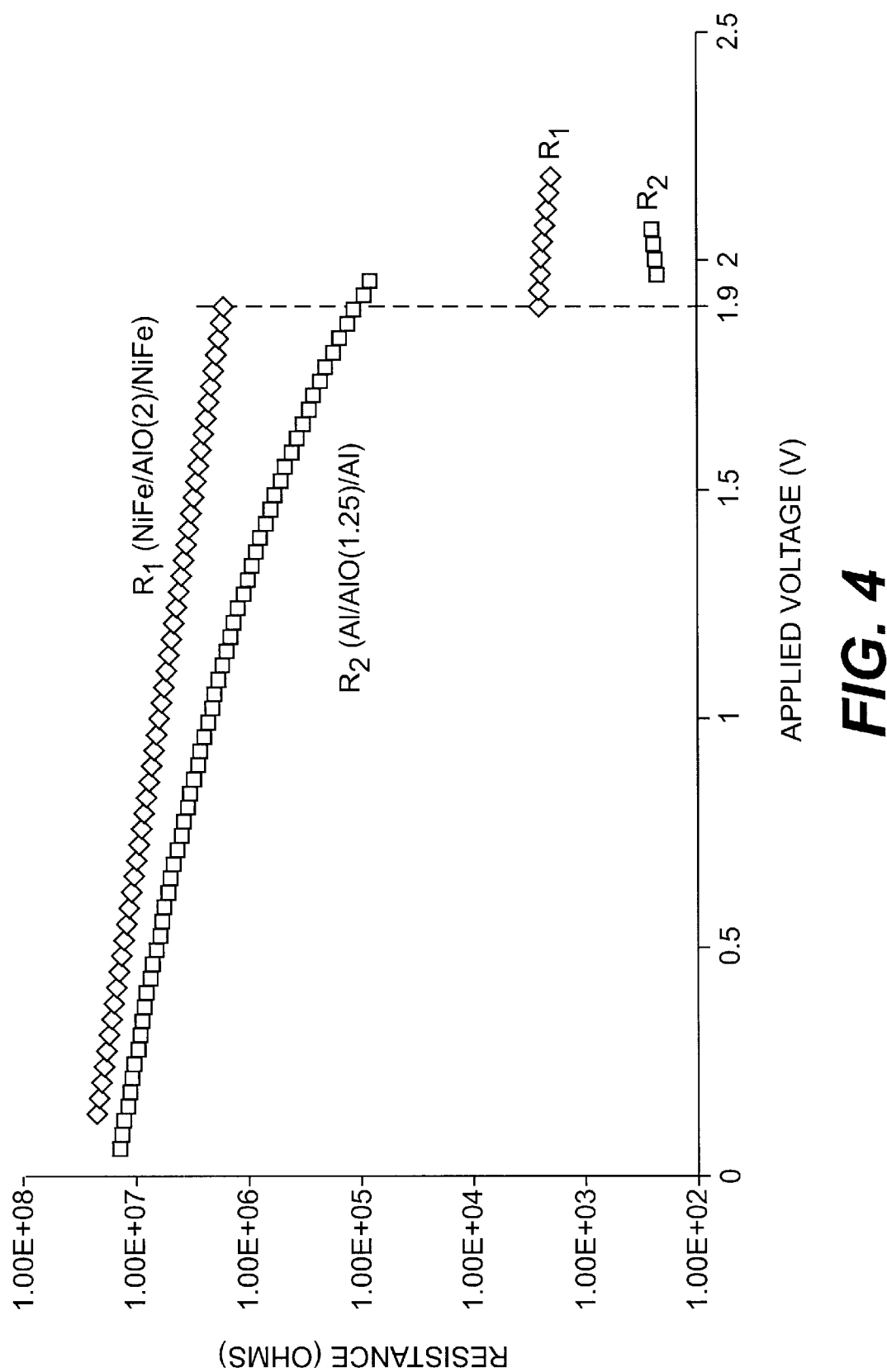
FIG. 4 is a plot of resistance of a tunnel junction versus voltage across the tunnel junction.

FIG. 4 is a plot of the resistances $R_1$ and $R_2$ of the tunnel junctions 134, 136, respectively, versus the voltage across the tunnel junctions 134, 136. In FIG. 4, the magnetic tunnel junction 134 has NiFe magnetic layers, or electrodes, and an AlO(2) insulator. The tunnel junction 134 includes Al conductors, or electrodes, and an AlO(1.25) insulator.

As shown in FIG. 4, the magnetic tunnel junction 134 has a resistance-voltage (R-V) curve that decreases more gradually than the R-V curve of the tunnel junction 136. This characteristic can be utilized to obtain a higher voltage drop across the magnetic tunnel junction 134 when a write voltage Vw or a write current Iw is applied to a selected memory cell 130. The selected memory cell 130 can therefore be programmed, or written to, by applying a write voltage Vw or a write current Iw calculated to generate a voltage drop $V_1$ across the magnetic tunnel junction 134 that exceeds a breakdown voltage $V_{B1}$ of the magnetic tunnel junction 134, and a voltage drop $V_2$ across the tunnel junction 136 that does not exceed a breakdown voltage $V_{B2}$ of the tunnel junction 136.

The write process can be explained with reference to the voltages generated when the write voltage Vw is applied to a selected memory cell 130. The write voltage Vw can result from the application of a constant current Iw to the selected memory cell 130, or the write voltage Vw can be directly applied to the selected memory cell 130.

If a write current Iw is applied, the voltages $V_1$ and $V_2$ are determined according to the following equations:

$$V_1 = I_w \cdot R_1 \quad (1)$$

$$V_2 = I_w \cdot R_2 \quad (2)$$

where:

$V_1$ is the voltage drop across the magnetic tunnel junction 134;

$V_2$ is the voltage drop across the tunnel junction 136;

$R_1$ is the resistance of the magnetic tunnel junction 134; and $R_2$ is the resistance of the tunnel junction 136.

As shown by the equations for $V_1$ and $V_2$, the resistances $R_1$ and $R_2$ determine the voltages $V_1$ and $V_2$ across the magnetic tunnel junction 134 and the tunnel junction 136. Values of $R_1$ and $R_2$ vary as the voltages $V_1$ and $V_2$ across the tunnel junctions 134, 136 increase, and can be determined by experimental or simulation data. Specific $V_1$ and $V_2$ values are tabulated below in Table 1.

Referring again to FIG. 4, the resistances $R_1$ and $R_2$ can initially (i.e., under no applied voltage) have similar or identical values. If a write current Iw is used to program a memory cell, the write current Iw creates the voltages $V_1$ and $V_2$ in the magnetic tunnel junction 134 and the tunnel junction 136, respectively. In FIG. 4, the breakdown voltage $V_{B1}$ of the magnetic tunnel junction 134 is approximately 1.9 volts. The breakdown voltage $V_{B2}$ of the tunnel junction may also be on the order of 1.9 volts. However, because the resistance $R_1$ of the magnetic tunnel junction 134 is much higher than the resistance $R_2$ of the tunnel junction 134 under the applied voltage Vw, the write current Iw may cause a voltage $V_1$ (where $V_1 = Iw \cdot R_1$) to exceed $V_{B1}$ while the voltage $V_2$ (where $V_2 = Iw \cdot R_2$) is well below $V_{B2}$.

An advantage to using a write current Iw to program the memory cells 130 is that once the magnetic tunnel junction 134 is blown, the voltage across the tunnel junction 136 remains substantially unchanged. This feature obviates the need for careful timing of the application of the write current Iw to program a selected memory cell 130.

As shown in FIG. 4, in the vicinity of the breakdown voltage $V_{B1}$ of the magnetic tunnel junction 134, the resistance $R_1$ is approximately an order of magnitude greater than the resistance $R_2$. The voltage $V_2$ is therefore well below $V_{B2}$, reducing the chance that the tunnel junction 136 will be inadvertently blown during a write operation.

If a write voltage Vw is used to program a memory cell 130, the voltages $V_1$ and $V_2$ are determined according to the following equations:

$$Vw = V_1 + V_2 \quad (3)$$

$$V_1 = Vw \cdot \frac{R_1}{R_1 + R_2} \quad (4)$$

$$V_2 = Vw \cdot \frac{R_2}{R_1 + R_2} \quad (5)$$

$$I = \frac{Vw}{R_1 + R_2} \quad (6)$$

where I is the current through the memory cell 130.

Because the resistance $R_1$ can be substantially higher than $R_2$ under an applied write voltage Vw, the voltage $V_2$ across the magnetic tunnel junction 134 can be significantly higher than the voltage $V_2$ across the tunnel junction 136. Therefore, even though the breakdown voltages $V_{B1}$ and $V_{B2}$ may be similar, $V_1$ exceeds $V_{B1}$ before $V_2$ exceeds $V_{B2}$.

Figure 5:
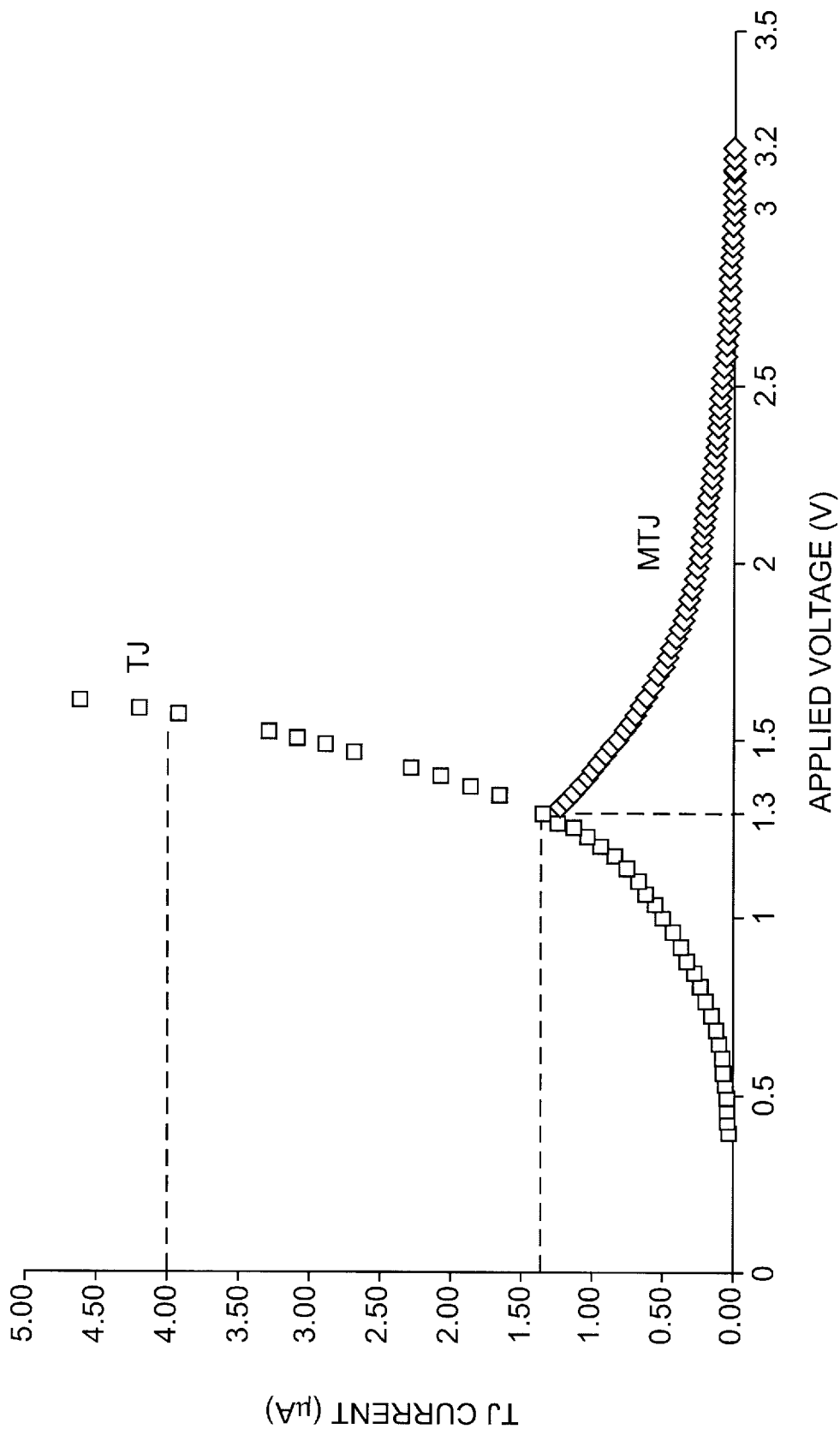
FIG. 5 is a plot of tunnel junction current versus applied voltage in a dual tunnel junction memory cell.

FIG. 5 is a plot of tunnel current versus applied voltage for the memory cell embodiment data illustrated in FIG. 4. If a write current Iw of approximately 1.4 volts is applied to a memory cell 130, a voltage of 3.2 volts is developed across the memory cell 130. As a result, there is a voltage $V_2$ across the tunnel junction (TJ) 136 of about 1.3 volts, and a voltage $V_1$ across the magnetic tunnel junction (MTJ) 134 of about 1.9 volts. The voltage $V_1$ causes the magnetic tunnel junction 134 to break down. When breakdown of the magnetic tunnel junction 134 occurs, the voltage across the tunnel junction 136 does not substantially change.

If a write voltage Vw is applied to a memory cell 130, the voltage Vw across the memory cell 130 is split among the magnetic tunnel junction 134 and the tunnel junction 136. If the write voltage Vw is about 3.2 volts, and $V_1$ and $V_2$ are determined according to equations 3–6 above. In this case, $V_1$ is about 1.9 volts, and $V_2$ is about 1.3 volts, causing the magnetic tunnel junction 134 to break down. In this situation, the voltage source used to supply the write voltage Vw is preferably current limiting. The current supplied by the voltage source can therefore be selected so that the tunnel junction 136 is not damaged when the magnetic tunnel junction 134 is blown.

The operation of the above embodiments will be discussed with reference to the following examples:

EXAMPLE 1

Referring to FIG. 3C, a memory cell 130 includes a first magnetic tunnel junction 134. The magnetic tunnel junction 134 has a first ferromagnetic layer 137 of NiFe, and a second ferromagnetic layer 138 of NiFe. The thickness of the ferromagnetic layers 137, 138 is about 4 nm. The insulator 140 is AlO, and has a thickness of about 2.5 nm. The anti-ferromagnetic layer 144 is made from IrMn and has a thickness of about 10 nm. The seed layer 146 is made from NiFe and Ta and has a thickness of about 11 nm.

The tunnel junction 136 includes first and second conductors 150, 152 of Al each having a thickness of 4 nm. The insulator 148 is made from AlO and has a thickness of 1.65 nm.

The R-V curve for the embodiment of this example is shown in FIG. 4. The resistance $R_1$ of the magnetic tunnel junction 134 decreases more gradually than the resistance $R_2$ of the tunnel junction 136. Both tunnel junctions 134 and 136 have a breakdown voltage of about 1.9 volts. In this example, a write voltage Vw of about 3.2 volts can be used to program the memory cell 130. As illustrated in FIG. 5, the write voltage Vw of 3.2 volts blows the magnetic tunnel junction 134, without blowing the tunnel junction 136. The write voltage Vw of 3.2 volts generates a voltage $V_1$ of 1.9 volts and a voltage $V_2$ of 1.3 volts. Alternatively, a write current Iw of about 1.4 µA blows the magnetic tunnel junction 134. A write current Iw of 1.4 µA blows the magnetic tunnel junction at a voltage $V_1$ of 1.9 volts. The voltage $V_2$ when the magnetic tunnel junction 134 blows is 1.3 volts.

The breakdown of the magnetic tunnel junction 134 occurs due to the migration of conductive materials through the insulator 140, which is the action of an anti-fuse. When the conductive materials traverse the insulator 140, the layers 137, 138 become electrically connected, which shorts the magnetic tunnel junction 134.

EXAMPLE 2

Referring again to FIG. 3C, a memory cell 130 includes a magnetic tunnel junction 134 similar to that of Example 1.

The tunnel junction 136 includes a first conductor electrode 150 of Al having a thickness of 4 nm, and a second ferromagnetic layer electrode 152 of NiFe having a thickness of 4 nm. The insulator 148 is made from AlO and has a thickness of 1.25 nm. The tunnel junction 136 includes one nonmagnetic electrode 150 and one magnetic electrode 152, and is therefore a form of "hybrid" tunnel junction.

Figure 6:
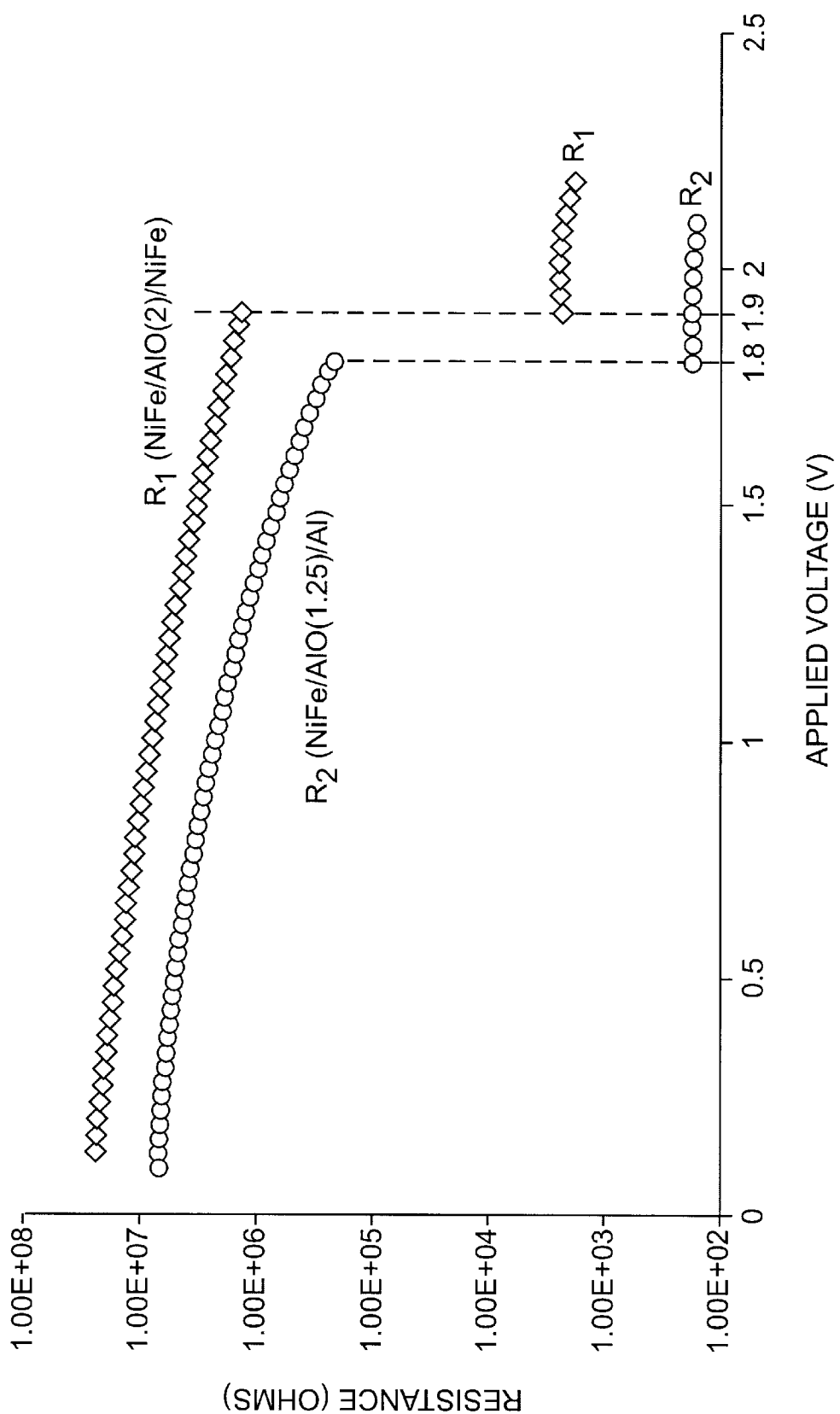
FIG. 6 is a plot of resistance of a tunnel junction versus voltage across the tunnel junction according to an alternative embodiment.

The R-V curve for the embodiment of this example is shown in FIG. 6. The resistance $R_1$ of the magnetic tunnel junction 134 decreases more gradually than the resistance $R_2$ of the tunnel junction 136.

In this example, a write voltage Vw of about 3.13 volts can be used to program the memory cell 130. The breakdown voltage $V_{B1}$ for the magnetic tunnel junction 134 is about 1.9 volts, and the breakdown voltage $V_{B2}$ for the tunnel junction 136 is about 1.8 volts. The write voltage Vw of 3.13 volts blows the magnetic tunnel junction 134. The voltage $V_1$ is 1.9 volts and the voltage $V_2$ is 1.23 volts when the magnetic tunnel junction 134 is blown.

Alternatively, a write current Iw of about 1.4 μA blows the magnetic tunnel junction 134. The write current Iw of 1.4 μA blows the magnetic tunnel junction at a voltage $V_1$ of 1.9 volts. The voltage $V_2$ is 1.23 volts under the applied write current Iw of 1.4 μA.

Figure 7:
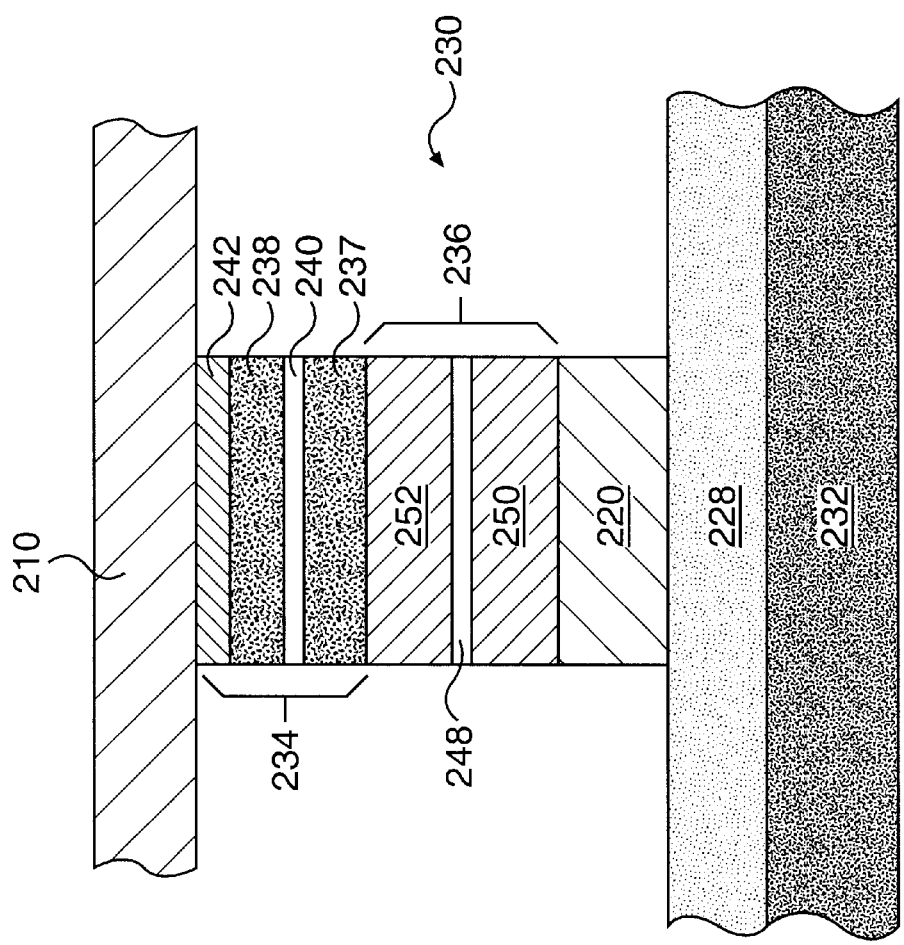
FIG. 7 is a cross sectional view of an alternative embodiment of a memory cell.

FIG. 7 illustrates an alternative embodiment of a memory cell 230. The memory cell 230 is suitable for use in a memory device 10 as illustrated in FIG. 2. The memory cell 230 comprises a magnetic tunnel junction 234 in series with a tunnel junction 236. The memory cell 230 does not include a seed layer or an anti-ferromagnetic layer.

The magnetic tunnel junction 234 includes a first magnetic layer 237 and a second magnetic layer 238. The first and second magnetic layers 237, 238 are separated by an insulator 240. The first and second magnetic layers 237, 238 may be ferromagnetic. The second magnetic layer 238 can be electrically coupled to the word line 210 by an electrode 242. Alternatively, the electrode 242 can be omitted.

The tunnel junction 236 is in series with the magnetic tunnel junction 234, forming the dual tunnel junction memory cell 230. The tunnel junction 236 comprises an insulator 248, a first conductor 250 coupling the insulator 248 to the bit line 220, and a second conductor 252 between the insulator 248 and the magnetic tunnel junction 234. Alternatively, the first conductor 250 can be omitted.

Figure 8:
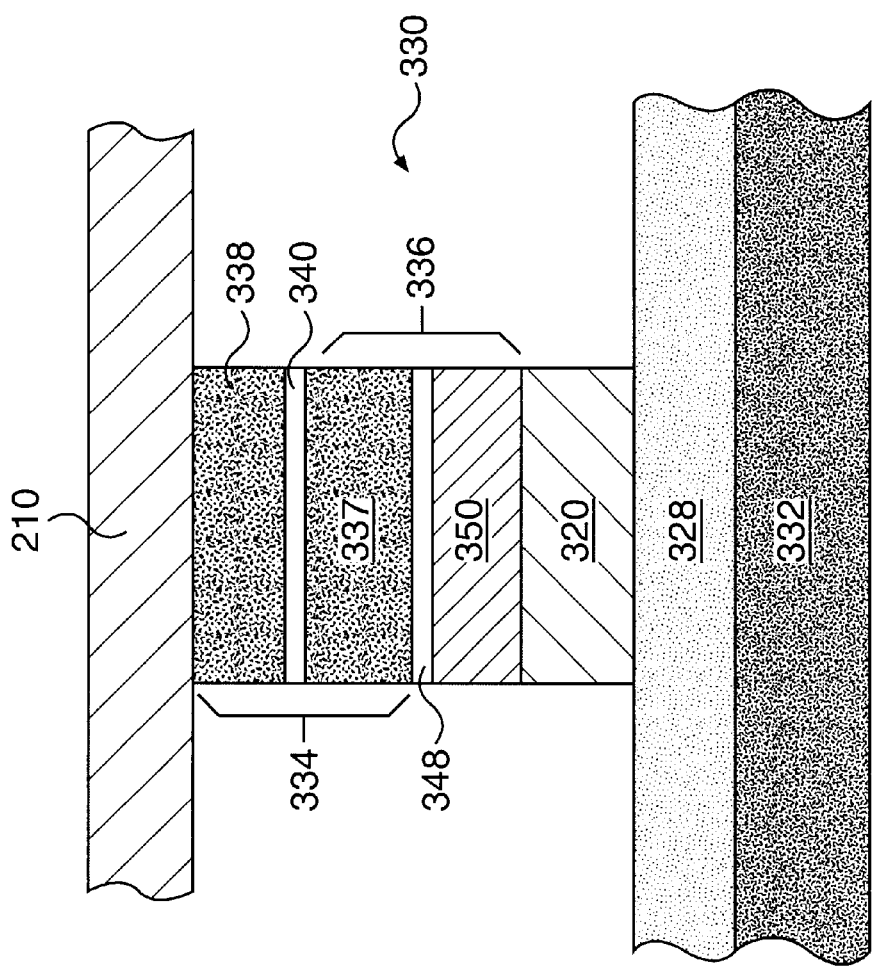
FIG. 8 is a cross sectional view of yet another alternative embodiment of a memory cell.

FIG. 8 illustrates a memory cell 330 having a magnetic tunnel junction 334 in series with a tunnel junction 336. The memory cell 330 is suitable for use in a memory device 10 as illustrated in FIG. 2.

The magnetic tunnel junction 334 comprises a ferromagnetic layer electrode 338, a ferromagnetic layer electrode 337, and an insulator 340. The tunnel junction 336 can be a tunnel junction 336 comprising a conductor 350 and an insulator 348, and the second tunnel junction can share the ferromagnetic layer electrode 337 with the first tunnel junction.

In this embodiment, the magnetic tunnel junction 334 has a lower breakdown voltage than the hybrid tunnel junction 336. Referring to FIG. 6, the tunnel junction 336 can have a V-R curve $R_2$, which has a lower resistance and decreases in resistance more rapidly than a resistance $R_1$ of the magnetic tunnel junction 334.

In the above embodiments, alternative materials for the first and second magnetic layers in the first tunnel junctions include, for example, CoFe, NiFeCo, Co, and NiFe. The magnetic layers can be formed by, for example, sputtering processes. The insulators in the tunnel junctions can be made from dielectric materials such as, for example, $SiO_X$, $SiN_X$, $SiO_XN_Y$, $AlO_X$, $TaO_X$, $TiO_X$, $AlN_X$, and other insulating materials. The insulators can have a thickness on the order of, for example, 0.5 nm to 50 nm, and can be formed using CVD processes, or other deposition processes.

The antiferromagnetic layers can be made from materials such as, for example, MnFe and IrMn, and can be formed using sputtering processes, or other known processes. The seed layers can be made from materials such as, for example, Ta and NiFe, and can be formed using, for example, sputtering processes, and other processes.

The conductors can be made from conductive materials such as, for example, Al, Cu, Ag, Au, and alloys thereof. The conductors can be formed using DC or RF sputter deposition processes, and other processes.

The following table summarizes experimental resistances and breakdown voltages for selected memory cell embodiments. The memory cells were blown by applying a write current Iw to generate a voltage $V_C$ across the memory cells. The values listed are the values of resistance $R_1$ and $R_2$ and voltage $V_1$ and $V_2$ for elements 1 and 2 in each cell when the breakdown voltage $V_{B1}$ of element 1 is reached (i.e., when the cell is blown). The materials listed under the "TJ OR MTJ IN A CELL" column represent the materials used to form the individual memory elements, such as the magnetic tunnel junctions and tunnel junctions, used in the cells. The materials listed correspond to the order electrode/insulator/electrode.

TABLE 1

| TJ OR MTJ IN A CELL | Iw (μA) | $V_C$ (V) | $V_1$ (V) | $R_1$ (MΩ) | $V_2$ (V) | $R_2$ (MΩ) |
|---|---|---|---|---|---|---|
| 1 NiFe/AlO(2)/NiFe 2 Al/AlO(1.25)/Al | 1.4 | 3.20 | 1.9 | 1.58 | 1.30 | .90 |
| 1 NiFe/AlO(2)/NiFe 2 NiFe/AlO(1.25)/Al | 1.4 | 3.13 | 1.9 | 1.58 | 1.23 | .86 |
| 1 NiFe/AlO(2)/NiFe 2 Al/AlO(1.25)/NiFe | 1.4 | 3.09 | 1.9 | 1.58 | 1.19 | .84 |

According to the above embodiments, the memory device 10 does not require active silicon-based isolation elements such as diodes or transistors in order to isolate the memory cells in the memory array 100. The memory device 10 can therefore include stacked memory elements, increasing device capacity. Tunnel junctions can be made relatively small, which further increases the possible array density for the array 100.

Another advantage to using magnetic tunnel junctions in series with tunnel junctions is that the R-V curves for magnetic tunnel junctions can differ significantly from the R-V curves of tunnel junctions simply due to the different electrode materials used. It is therefore unnecessary to use complicated and expensive modifications in memory cell geometry in order to ensure that the voltage across one tunnel junction is exceeded while the other is not.

As a further advantage, the elements of the memory cells can be manufactured at low cost using known fabrication processes.

Referring to FIG. 2, a write process for the memory device 10 will now be discussed with reference to the memory cell embodiment illustrated in FIGS. 3A–3C. In the following description, a write current Iw is applied to program a memory cell 130.

Referring to FIG. 2, in order to write to a selected memory cell 130, a write current Iw is applied to the word line 110 that intersects a selected memory cell 130. The write current Iw may be applied by closing a switch in the row decoder 300 to connect the selected word line 110 to Iw. Switches in the row decoder 300 connected to unselected word lines 110 are open. At the same time, the column decoder 400 connects the bit line 120 intersecting the selected memory cell 130 to ground. The write current Iw therefore flows through the selected word line 110, through the selected memory cell 130, and through the selected bit line 120 to ground. Switches to unselected bit lines 120 are open.

The write current Iw results in a write voltage $V_C$ across the selected memory cell 130. The voltage $V_C$ is equal to the voltage $V_1$ across the magnetic tunnel junction 134 plus the voltage $V_2$ across the tunnel junction 136. Referring to FIG. 3C, the voltage $V_1$ exceeds the breakdown voltage $V_{B1}$ of the magnetic tunnel junction 134, and blows the magnetic tunnel junction 134 in the selected memory cell 130. The voltage $V_2$ does not exceed the breakdown voltage $V_{B2}$ of the tunnel junction 136. The voltage $V_1$ acts to diffuse conductive materials across the insulator 140, blowing the magnetic tunnel junction 134. This process is the action of an anti-fuse.

Blowing the magnetic tunnel junction 134 changes the resistance of the memory cell 130 from a first state to a second state, which is detectable by a read process. After the magnetic tunnel junction 134 is blown, the anti-fuse action can reduce the resistance across the magnetic tunnel junction 134 by, for example, an order of magnitude or more. The resultant resistance may be close to zero (i.e., a short). Therefore, after the write process, the resistance of the memory cell 130 may be approximated by the resistance across the tunnel junction 136.

The write process for the embodiments illustrated in FIGS. 7 and 8 are similar to the above-described write process.

The memory cells 130 and 330 may be designed so that the magnetic tunnel junctions include one magnetic layer with a fixed orientation of magnetization and another magnetic layer including a magnetization orientation that can be parallel or anti-parallel to the fixed magnetization. Magnetic tunnel junctions have a higher resistance in the anti-parallel state, so the magnetic tunnel junctions can advantageously be placed in an anti-parallel state prior to programming the memory array 100. Placing the magnetic tunnel junctions in the anti-parallel state prior to programming selected cells increases the change in resistance of a selected cell when the cell is blown. The larger change in resistance is easier to distinguish during a read process.

The memory cells 130, 330 can be placed in an anti-parallel state using write currents supplied by column and row decoders 300, 400, as in conventional MRAM applications. Alternatively, the memory array 100 can have its memory cells placed in an anti-parallel state during fabrication by setting the device in a magnetic field strong enough to set the anti-parallel state, without disturbing the pinned layer magnetization.

The memory cell embodiments described in this specification can alternatively be programmed by applying a write voltage Vw to a selected memory cell 130.

In the above write processes, the row decoder 300 and the column decoder 400 can be responsive to feedback sensors (not illustrated) that sense current flow through a selected memory cell. The feedback sensors can indicate when the magnetic tunnel junction of a selected memory cell is blown, and can cease a write process at that time.

A read process for the memory device 10 will now be discussed with reference to FIG. 2. The memory device 10 can advantageously employ an equipotential read process, as disclosed in U.S. Pat. Ser. No. 6,259,644 to Tran et al., the contents of which are hereby incorporated by reference. An equipotential read process is outlined below with reference to memory cells 130, however the process described is appropriate for a memory device 10 employing any of the memory cell embodiments described in this specification.

In order to determine a binary state of (i.e., to read) a selected memory cell 130, a read potential Vr is applied to the word line 110 corresponding to the row of the selected memory cell 130, and the bit line 120 corresponding to the column of the selected memory cell 130 is coupled to the sense amplifier 500 through the column decoder 400. An equal potential can be applied to all other bit lines 120 in the memory array 100. The sense amplifier 500 senses the current from the selected bit line 120 to determine the binary state of the selected memory cell 130. The binary state may be detected by a processing device (not shown) coupled to an output from the sense amplifier 500, the output of the sense amplifier 500 indicating the resistance state of the selected memory cell 130. Alternatively, the sense amplifier 500 can include circuitry to determine the binary state, and to output the binary state to a processing device.

The binary state of the selected memory cell 130 can be determined as a change in resistance of the selected memory cell 130 from a high, first value to a low, second value after a write process. For example, a first, high resistance state results in a low current through the memory cell 130, which can indicate a binary state of "0." A second, low resistance state (after blowing a magnetic tunnel junction 134) results in a high current through the memory cell 130, and can indicate a binary state of "1."

After a write process, a memory cell 130 retains the tunnel junction 136 in an unshorted state. Therefore, there is no short in the memory array 100 after programming the selected memory cell 130. This isolation function allows a plurality of the cells 130 to be programmed without adversely affecting read and write processes in the memory array 100.

According to the above embodiments, binary states of "1" or "0" can be stored in the memory cells. The first, high resistance state of the memory cells before writing can correspond to a binary state of "0" for the memory cells, and the second, reduced resistance state can correspond to a binary state of "1." This convention, however, is arbitrary, and the assignment of the binary state of "0" can be reassigned to "1," or any other symbolic value.

In this specification, the conventions for current flow to write states of "0" and "1" in the memory array are arbitrary, and can be reassigned to fit any desired application of the memory device 10.

The above embodiments are discussed in terms of shorting the magnetic tunnel junction in order to change the resistance of a memory cell from a first, high state to a second, low state. The resistance of a memory cell may also be changed by partially diffusing conductive materials across the magnetic tunnel junction insulator. This is referred to as a "partial blow." A partial blow of the magnetic tunnel junction reduces the resistance of the magnetic tunnel junction without shorting the magnetic tunnel junction. The diffusion of conductive elements across the dielectric reduces the resistance of the programmed memory cell perceptibly, and the change in resistance can be detected by a read process.

In this specification, the terms "row," "column," "word," and "bit" do not imply a fixed orientation in a memory array. In addition, these terms do not necessarily imply an orthogonal relationship.

In this specification, the term "layer" is used to describe various elements in the memory cell embodiments. The term "layer" is not intended to be limited to any particular thickness, width, or aspect ratio.

The sense amplifier 500 illustrated in FIG. 2 is an example of a sensing device for detecting a binary state of the memory cells in the memory device 10. In practice, other sensing devices, such as a trans-impedance sense amplifier, a charge-injection sense amplifier, a differential sense amplifier, or a digital differential sense amplifier, for example, can be used. One sense amplifier 500 is illustrated for sensing the binary state of the memory cells in the memory array 100. In practice, a greater number of sensing devices can be coupled to a memory array.

The memory array 100 can be used in a wide variety of applications. One application may be a computing device having a storage module. The storage module may include one or more memory arrays 100 for long term storage. The storage module can be used in devices such as laptop computers, personal computers, and servers.

While the memory device 10 is described with reference to exemplary embodiments, many modifications will be readily apparent to those skilled in the art, and the present disclosure is intended to cover variations thereof.

What is claimed is:

1. A memory cell, comprising:
   a first magnetic tunnel junction comprising two magnetic layers and an insulator disposed between the magnetic layers; and
   a second tunnel junction comprising an insulator and at least one conductor in series with the first tunnel junction, wherein the first tunnel junction may be changed from a first resistance state to a second resistance state and wherein a resistance of the first tunnel junction decreases more gradually than a resistance of the second tunnel junction when a voltage is developed across the memory cell such that a breakdown voltage of the first tunnel junction is exceeded during a write operation to change the memory cell from the first resistance state to the second resistance state.

2. The memory cell of claim 1, wherein the second tunnel junction comprises:
   two conductors, one conductor disposed on either side of the insulator.

3. The memory cell of claim 1, wherein the second tunnel junction shares one of the magnetic layers of the first tunnel junction.

4. The memory cell of claim 3, wherein the second tunnel junction comprises:
   a conductor, and wherein the insulator is disposed between the conductor and the shared magnetic layer.

5. The memory cell of claim 1, wherein the magnetic layers are ferromagnetic.

6. The memory cell of claim 1, wherein the insulators are made from dielectric materials.

7. A memory array, comprising:
   a substrate;
   an array of memory cells disposed over the substrate;
   a plurality of word lines coupled to the memory cells; and
   a plurality of bit lines coupled to the memory, wherein the word lines cross the bit lines at the memory cells, and wherein a memory cell comprises:
      a first magnetic tunnel junction comprising two magnetic layers and an insulator disposed between the magnetic layers; and
      a second tunnel junction comprising an insulator and at least one conductor in series with the first tunnel junction, wherein the first tunnel junction may be changed from a first resistance state to a second resistance state and a resistance of the first tunnel junction decreases more gradually than a resistance of the second tunnel junction when a voltage is developed across the memory cell such that a breakdown voltage of the first tunnel junction is exceeded during a write operation to change the memory cell from the first resistance state to the second resistance state.

8. The memory array of claim 7, wherein the second tunnel junction comprises:
   two conductors, one conductor disposed on either side of the insulator.

9. The memory array of claim 7, wherein the second tunnel junction shares one of the magnetic layers of the first tunnel junction.

10. The memory array of claim 7, wherein the magnetic layers are ferromagnetic.

11. A method of writing to a memory array comprising an array of memory cells, a plurality word lines coupled to the memory cells, and a plurality of bit lines coupled to the memory cells, each memory cell comprising a magnetic tunnel junction in series with a tunnel junction, the method comprising:
   applying one of a write voltage or a write current to a selected memory cell, wherein a resistance of the magnetic tunnel junction of the selected memory cell is changed from a first state to a second state, wherein the write voltage or write current develops a voltage across the magnetic tunnel junction that is at least equal to a breakdown voltage of the magnetic tunnel junction, and wherein the write voltage or write current develops a voltage across the tunnel junction that is less than a breakdown voltage of the tunnel junction.

* * * * *